(12) United States Patent
Woods et al.

(10) Patent No.: US 9,875,754 B2
(45) Date of Patent: Jan. 23, 2018

(54) METHOD AND APPARATUS FOR PRE-PROCESSING SPEECH TO MAINTAIN SPEECH INTELLIGIBILITY

(71) Applicant: Starkey Laboratories, Inc., Eden Prairie, MN (US)

(72) Inventors: William S. Woods, Berkeley, CA (US); Tarun Pruthi, Eden Prairie, MN (US); Jinjun Xiao, Chanhassen, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 38 days.

(21) Appl. No.: 14/273,346

(22) Filed: May 8, 2014

(65) Prior Publication Data
US 2015/0325250 A1 Nov. 12, 2015

(51) Int. Cl.
| | |
|---|---|
| *G10L 21/02* | (2013.01) |
| *G10L 21/0208* | (2013.01) |
| *H04R 25/00* | (2006.01) |
| *H03G 3/00* | (2006.01) |
| *G10L 21/0364* | (2013.01) |
| *G10L 21/0332* | (2013.01) |

(52) U.S. Cl.
CPC ...... *G10L 21/0208* (2013.01); *G10L 21/0364* (2013.01); *H03G 3/00* (2013.01); *H04R 25/00* (2013.01); *H04R 25/43* (2013.01); *G10L 21/0332* (2013.01); *H04R 25/55* (2013.01); *H04R 2225/43* (2013.01); *H04R 2430/03* (2013.01)

(58) Field of Classification Search
CPC .................................................. G10L 21/02
USPC ....................................................... 704/205
See application file for complete search history.

(56) References Cited

U.S. PATENT DOCUMENTS

| | | | |
|---|---|---|---|
| 7,599,507 B2 | 10/2009 | Hansen et al. | |
| 7,738,666 B2 | 6/2010 | Marquis | |
| 8,542,855 B2 * | 9/2013 | Elmedyb | H04R 25/552 381/23.1 |
| 2008/0205660 A1 | 8/2008 | Goldstein | |
| 2009/0016541 A1 | 1/2009 | Goldstein et al. | |

(Continued)

FOREIGN PATENT DOCUMENTS

EP 2372700 A1 10/2011

OTHER PUBLICATIONS

Brouckxon et al.; "Time and Frequency Dependent Amplification for Speech Intelligibility Enchancement in Noisy Environments"; Sep. 22-26, 2008; 9th Annual Conference of the International Speech Communication Association; pp. 1-4.*

(Continued)

*Primary Examiner* — David Hudspeth
*Assistant Examiner* — Shreyans Patel
(74) *Attorney, Agent, or Firm* — Schwegman Lundberg & Woessner, P.A.

(57) ABSTRACT

An audio system processes a speech signal to maintain a target value of the speech intelligibility index (SII) while minimizing the overall speech level so that speech intelligibility is preserved across different environmental sound levels while possible distortions and overall loudness are mitigated. In one embodiment, a hearing aid processes a speech signal received from another device to maintain a target value of the SII while minimizing the overall speech level before mixing the speech signal with a microphone signal.

23 Claims, 5 Drawing Sheets

(56) References Cited

U.S. PATENT DOCUMENTS

| | | |
|---|---|---|
| 2011/0194713 A1 | 8/2011 | Apfel et al. |
| 2011/0224976 A1* | 9/2011 | Taal .................. G10L 25/69 |
| | | 704/205 |
| 2013/0195302 A1* | 8/2013 | Meincke ............. G10L 21/02 |
| | | 381/321 |
| 2013/0297306 A1 | 11/2013 | Hetherington |

OTHER PUBLICATIONS

Brouckxon, H., et al., "Time and Frequency Dependent Amplification for Speech Intelligibility", Proc. Interspeech, (2008), 557-560.

Sauert, B., et al., "Near-End Listening Enhancement in the Presence of Bandpass Noises", Proceedings of Speech Communication; 10. ITG Symposium, (2012), 1-4.

Taal, C. H, et al., "On Optimal Linear Filtering of Speech for Near-End Listening Enhancement", IEEE Signal Processing Letters, 20(3), (2013), 225-228.

Yoo, S. D, et al., "Speech signal modification to increase intelligibility in noisy environments", J Acoust Soc Am., 122(2), (Aug. 2007), 1138-49.

"European Application No. 15166981.9, Extended European Search Report dated Aug. 10, 2015", 5 pgs.

Kleijn, W B, et al., "Optimizing Speech Intelligibility in a Noisy Environment: A unified view", IEEE Signal Processing Magazine, IEEE Service Center, Piscataway, NJ, US, vol. 32, No. 2, XP011573086, ISSN: 1053-5888, DOI: 10.1109/MSP.2014.2365594, XP011573086, ISSN: 1053-5888, DOI: 10.1109/MSP.2014.2365594, (Mar. 1, 2015), 43-54.

* cited by examiner

METHOD AND APPARATUS FOR PRE-PROCESSING SPEECH TO MAINTAIN SPEECH INTELLIGIBILITY

TECHNICAL FIELD

This document relates generally to audio systems and more particularly to method and apparatus for processing a speech signal to maintain its speech intelligibility.

BACKGROUND

When an audio signal including speech is sent from a transmitting device to a receiving device, the speech intelligibility may be affected by background noise from both the transmitting and receiving sides. For example, when listening to a telephone phone call via a hearing aid, the audio signal transmitted by the telephone is mixed with an environmental sound signal sensed by the microphone of the hearing aid to maintain the hearing aid wearer's awareness of surroundings. Because the level of the received speech and the level of noise at the receiving side may vary dynamically, there is a need to maintain speech intelligibility as well as listening comfort for the listener continuously and automatically.

SUMMARY

An audio system processes a speech signal to maintain a target value of the speech intelligibility index (SII) while minimizing the overall speech level so that speech intelligibility is preserved across different environmental sound levels while possible distortions and overall loudness are mitigated. In one embodiment, a hearing aid processes a speech signal received from another device to maintain a target value of the SII while minimizing the overall speech level before mixing the speech signal with a microphone signal.

In one embodiment, an audio system includes a speech input configured to receive a speech signal including speech, an environmental sound input configured to receive an environmental sound signal representing sounds in a listening environment, and a processing circuit configured to process the speech signal and the environmental sound signal. The processing circuit includes a speech filter and a gain computer. The speech filter is configured to filter the speech signal by applying gains as a function of frequency to the speech signal. The gain computer configured to compute the gains using the received speech signal and the received environmental sound signal to maintain the SII at a target value while minimizing a total energy of the speech at all frequencies.

In one embodiment, a hearing assistance system including a communication circuit, a microphone, a processing circuit, and a receiver (speaker). The communication circuit is configured to receive a speech signal including speech. The microphone is configured to receive an environmental sound and produce a microphone signal representing the environmental sound. The processing circuit is configured to process the speech signal and the microphone signal and produce an output signal based on the speech signal and the microphone signal. The processing circuit includes a speech filter, a gain computer, and an output circuit. The speech filter is configured to filter the speech signal by applying gains as a function of frequency to the speech signal. The gain computer is configured to compute the gains using the received speech signal and the microphone signal to maintain the SII at a target value while minimizing a total energy of the speech at all frequencies. The output circuit is configured to produce an output signal using the filtered speech signal and the microphone signal. The receiver is configured to produce an output sound using the output signal and transmit the output sound to the ear canal of a listener.

In one embodiment, a method for delivering sound to a listener is provided. A speech signal including speech is received. An environmental sound signal representing sounds in the listener's environment is received. The speech signal is filtered by a plurality of filters for a plurality of frequency subbands. Each filter of the plurality of filters has an adjustable gain. The gains for the plurality of filters are computed using the received speech signal and the received environmental sound signal to maintain the SII at a target value while minimizing the total energy of the speech over the plurality of frequency subbands. The gains are each computed as a function of the frequency subband of the plurality of frequency subbands. The output sound is produced using the filtered speech signal and the environmental sound signal, and transmitted to the listener.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

DETAILED DESCRIPTION

Figure 1:
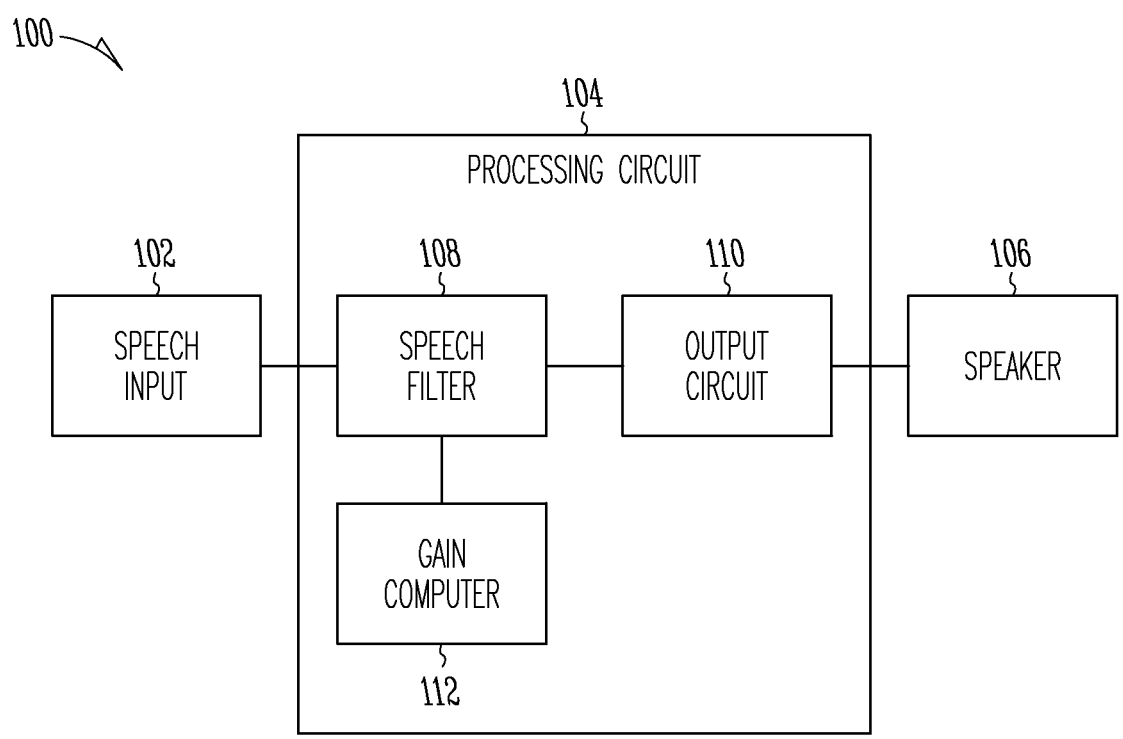
FIG. 1 is a block diagram illustrating an embodiment of an audio system for processing a speech signal to maintain the speech intelligibility index (SII).

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

This document discusses, among other things, an audio system that receives a speech signal and processes the speech signal to maintain intelligibility of speech before presenting to a listener who may listen to the speech in a noisy environment. An example of the audio system is a hearing assistance system including a hearing aid that receives a speech signal from a telephone and mixes the speech signal with an environmental sound signal sensed by a microphone of the hearing aid. When the mixture level is fixed and the level of the environmental sound signal increases, the listener (hearing aid wearer) may have to manually increase the telephone mixture value or reduce the microphone mixture value to maintain speech intelligibility. The present audio system provides for continuous and automatic modification of the telephone mixture value.

In this document, a "speech signal" includes an audio signal that is transmitted from a "far-end" and includes a speech that is intended to be heard by a listener in a "near-end". An "environmental sound signal" includes a signal representing the listener's acoustic environment, i.e., sounds in the near-end environment. Both the far-end and near-end environments may be noisy. In other words, the speech signal may include a far-end noise, and the environmental sound signal may include a near-end noise, background speech, and/or even the listener's own speech. The present audio system enhances speech intelligibility of the speech signal before presenting it in the near-end environment, such as before mixing it with the environmental sound signal.

Previous approaches to automatic control for enhancing speech intelligibility include identifying "important speech parts" in a speech signal, such as formants or transients, and attempting to amplify them or otherwise enhance them. Examples are discussed in H. Brouckxon, et al, "Time and Frequency Dependent Amplification for Speech Intelligibility", *Proc. Interspeech*, 557-560, (2008) and S. D. Yoo et al., "Speech signal modification to increase intelligibility in noisy environments," *J. Acoust. Soc. Am.* 122 (2): 1138-1149 (2007). This type of approach is difficult to implement in hearing aids. Other previous approaches maximize the speech intelligibility index (SII) while keeping the overall level of the speech constant. Examples are discussed in C. Taal et al., "On optimal linear filtering of speech for near-end listening enhancement," *IEEE Signal Processing Letters* 20(3): 225-228 (2013) and B. Sauert et al., "Near-End Listening Enhancement in the Presence of Bandpass Noises," *ITG-Fachbericht* 236: *Sprachkommunikation,* 26-28 Sep. 2012. In this type of approach, because the SII value may decrease, the listener may experience a decrease in speech intelligibility as the level of the environmental sound signal increases. In other words, the range of environmental sound spectra and levels over which this type of approach is applicable is relatively limited.

The present subject matter provides a method for computing speech gains as a function of frequency that maintain a target value of the speech intelligibility index (SII) while minimizing the overall speech level. The SII is a standard measure that is highly correlated with the intelligibility of speech, as defined in ANSI S3.5-1997, *American National Standard Methods for Calculation of the Speech Intelligibility Index*. In the present audio system, the SII value is maintained at a substantially constant level so that speech intelligibility is preserved across different environmental sound levels, and the overall speech level is minimized to mitigate against possible distortions due to limited dynamic range portions of the system (such as wireless encoding and decoding), and to mitigate against overly loud sound presentation to the listener.

In various embodiments, the SII value is substantially fixed, while speech level is allowed to change. This approach is advantageous over previous solutions such as those discussed above because the speech intelligibility is maintained over a wider range of noise spectral shapes and levels. The speech level with this method may be greater than with the previous method (which keeps speech level constant), but an increased speech level may be required to preserve speech intelligibility as the environmental sound level increases.

While hearing aid is discussed as a specific example, the present subject matter can be used in any audio system that processes a received speech signal to maintain speech intelligibility in the presence of environmental/background sound (including noise).

FIG. 1 is a block diagram illustrating an embodiment of an audio system 100 for delivering speech to a listener. Audio system 100 includes a speech input 102, a processing circuit 104, and a speaker 106. Speech input 102 receives a speech signal including the speech from another device. The speech signal may include the speech and a noise such as the background noise (i.e., far-end noise). Processing circuit 104 processes the speech signal and includes a speech filter 108, a gain computer 112, and an output circuit 110. Speech filter 108 filters the speech signal by applying gains as a function of frequency to the speech signal. Gain computer 112 computes the gains to maintain the SII at a target value while minimizing a total energy of the speech at all frequencies. Output circuit 110 produces an output signal using the filtered speech signal. Speaker 106 produces an output sound using the output signal and transmits the output sound to the listener. In various embodiments, the target value for the SII may be set by the listener, for example by setting the volume of the output sound.

Figure 2:
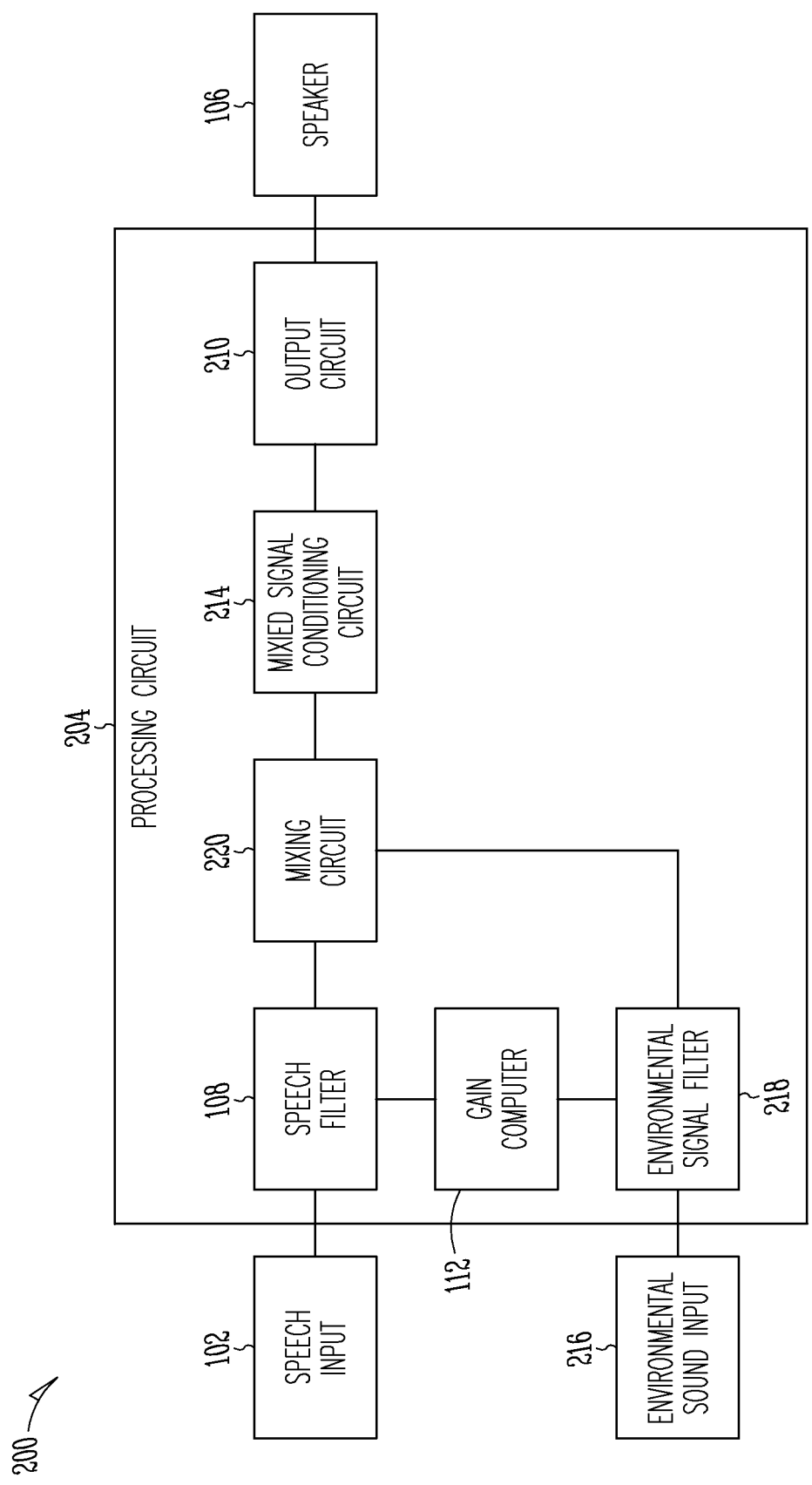
FIG. 2 is a block diagram illustrating another embodiment of an audio system for processing a speech signal to maintain the SII.

FIG. 2 is a block diagram illustrating another embodiment of an audio system 200, which represents a further embodiment of audio system 100 for delivering the speech to the listener simultaneously with sounds from the listener's environment (near-end sounds). Audio system 200 includes speech input 102, an environmental sound input 216, a processing circuit 204, and speaker 106.

Speech input 102 receives the speech signal including the speech. Environmental sound input 216 receives an environmental sound signal representing sounds in the listener's environment. Processing circuit 204 represents a further embodiment of processing circuit 104 and processes the speech signal and the environmental sound signal, and produces an output signal based on the speech signal and the environmental sound signal. Processing circuit 204 includes speech filter 108, gain computer 112, an environmental signal filter 218 if needed, a mixing circuit 220, a mixed signal conditioning circuit 214, and an output circuit 210. Speech filter 108 filters the speech signal by applying gains as a function of frequency to the speech signal. Gain computer 112 computes the gains using the speech signal and the environmental sound signal to maintain the SII at a target value while minimizing a total energy of the speech at all frequencies. The computed gain is applied to only the speech signal using speech filter 108, i.e., before mixing the speech signal with the environmental sound signal. Environmental signal filter 218 filters the environmental sound signal when necessary or desirable, and may include a band-pass filter with a gain. Mixing circuit 220 produces a combined signal by mixing the filtered speech signal with the environmental sound signal (the filtered environmental sound signal if the received environmental sound signal is routed through environmental signal filter 218). Mixed signal conditioning circuit 214 conditions the combined signal (mixed signal) by applying signal processing techniques selected for the combined signal to have desirable characteristics. Output circuit 210 represents a further embodiment of output circuit 110 and produces an output signal using the conditioned combined signal. Speaker 106 produces the output sound using the output signal and transmits the output sound to the listener.

In one embodiment, speech filter 108 is a filter bank including a plurality of filters for a plurality of frequency subbands. Each filter of the plurality of filters has a gain that is applied to the subband of that filter. Gain computer 112 computes the gains to maintain the SII at the target value for all the subbands while minimizing a total energy of the speech over all the subbands.

Figure 3:
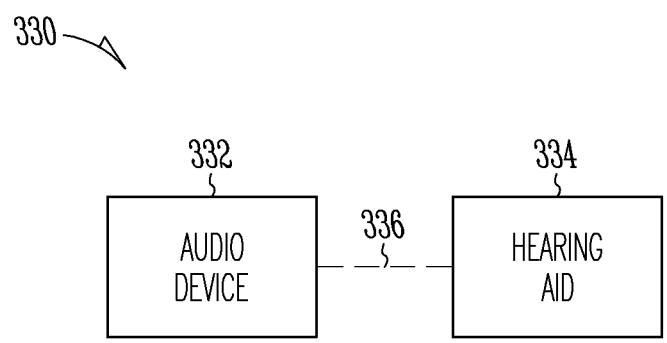
FIG. 3 is a block diagram illustrating an embodiment of a hearing assistance system including a hearing aid receiving a speech signal from an audio device.

FIG. 3 is a block diagram illustrating an embodiment of a hearing assistance system 330, which includes a hearing aid 334 receiving a speech signal from an audio device 332 via link 336. In various embodiments, link 336 may include a wired link or a wireless link.

Audio device 332 transmits a speech signal including speech to be delivered to a listener being a hearing aid user (wearer of hearing aid 334). Hearing aid 334 receives the speech signal and delivers the speech to the hearing aid user. In various embodiments, audio device 332 includes any "hearing aid compatible" device that is capable of transmitting a speech signal that can be received and processed by one or more hearing aids. Examples of such hearing-aid compatible audio device include a telephone and an audio streaming device. In various embodiments, hearing aid 334 includes an embodiment of audio system 200 to maintain speech intelligibility.

Figure 4:
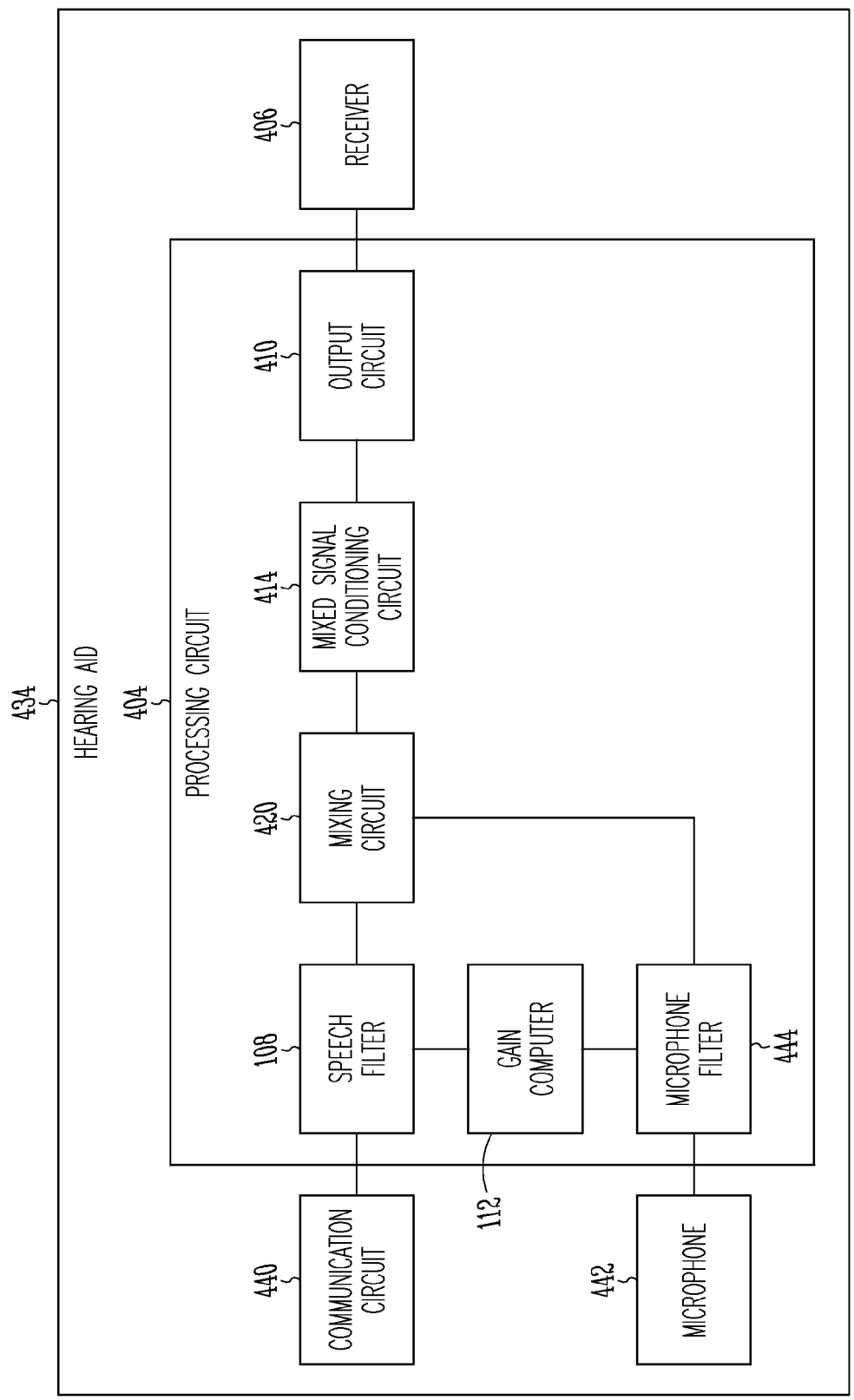
FIG. 4 is a block diagram illustrating an embodiment of a hearing aid of the hearing assistance system.

FIG. 4 is a block diagram illustrating an embodiment of a hearing aid 434, which represents an embodiment of hearing aid 334. Hearing aid 434 includes a communication circuit 440, a microphone 442, a processing circuit 404, and a receiver (speaker) 406.

Communication circuit 440 receives a speech signal including speech to be delivered to the listener being the hearing aid user (wearer of hearing aid 434). In various embodiments, communication circuit 404 receives the speech signal from an audio device such as audio device 332 via a wired or wireless communication link. Microphone 442 receives an environmental sound and produces a microphone signal representing the environmental sound. Processing circuit 404, which represents an embodiment of processing circuit 204, processes the speech signal and the microphone signal, and produces an output signal based on the speech signal and the microphone signal. Receiver 406 produces an output sound using the output signal and transmits the output sound to the hearing aid user.

Processing circuit 404 includes speech filter 108, gain computer 112, a microphone filter 444 (if needed), a mixing circuit 420, a mixed signal conditioning circuit 414, and an output circuit 410. Speech filter 108 filters the speech signal by applying gains as a function of frequency to the speech signal. Gain computer 112 computes the gains to maintain the SII at a target value while minimizing a total energy of the speech at all frequencies. In one embodiment, speech filter 108 is a filter bank including a plurality of filters for a plurality of frequency subbands. Each filter of the plurality of filters has a gain that is applied to the subband of that filter. Gain computer 112 computes the gains using the speech signal and the microphone signal to maintain the SII at the target value for all the subbands while minimizing a total energy of the speech over all the subbands. The computed gain is applied to only the speech signal using speech filter 108, i.e., before mixing the speech signal with the microphone signal. Microphone filter 444 filters the microphone signal when needed. In one embodiment, microphone filter 444 applies band-pass filtering and amplification to the microphone signal. Mixing circuit 420 produces a combined signal by mixing the filtered speech signal with the microphone signal (the filtered microphone signal when microphone filter 444 is applied). Mixed signal conditioning circuit 414 conditions the combined signal (mixed signal combining the filtered speech and microphone signals) by applying signal processing techniques selected for the combined signal to have desirable characteristics. Output circuit 410 produces the output signal using the combined signal.

Figure 5:
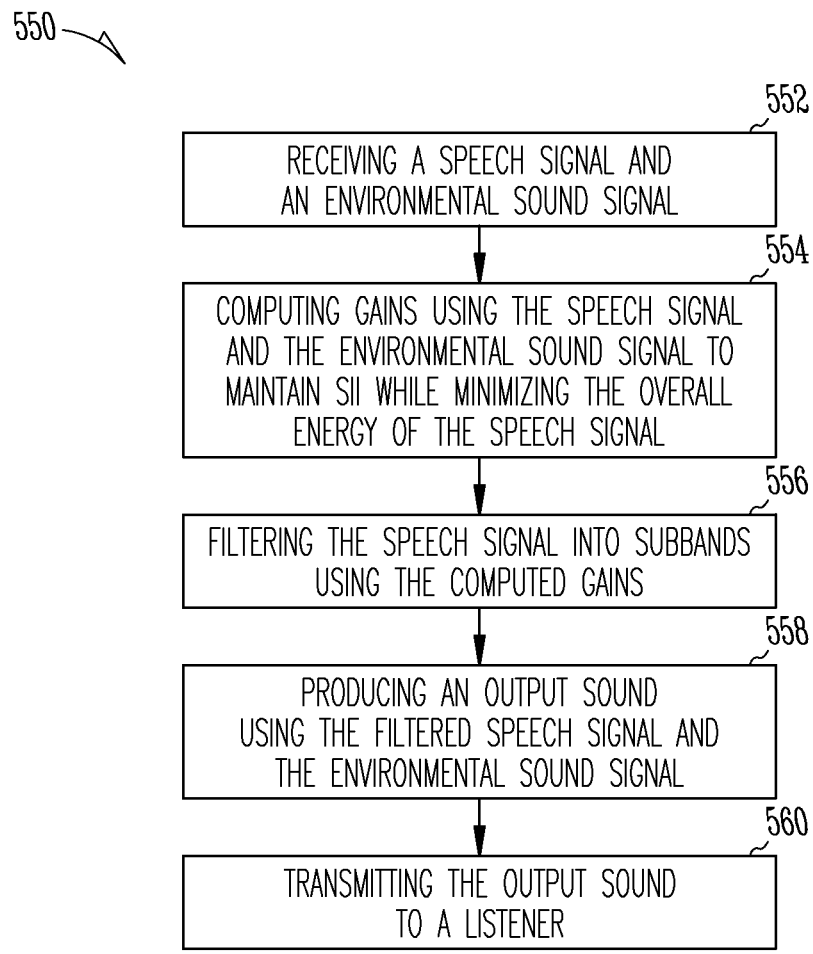
FIG. 5 is a flow chart illustrating an embodiment of a method for filtering a speech signal to maintain the SII.

FIG. 5 is a flow chart illustrating an embodiment of a method 550 for delivering a speech to a listener, including filtering a speech signal to maintain the SII. In various embodiments, method 550 is performed by audio system 100, audio system 200, hearing aid 334, or hearing aid 434 as discussed above in this document.

At 552, the speech signal including the speech is received. An environmental sound signal representing sounds in the listener's environment is also received.

At 554, the gains for a plurality of filters for a plurality of frequency subbands are each computed as a function of the frequency subband using the received speech signal and the received environmental sound signal. The gains are computed to maintain the SII at a target value while minimizing the total energy of the speech over the plurality of frequency subbands. In one embodiment, the gains are computed using a solution to a mathematically formulated constrained optimization problem with an objective function formulated to minimize the total energy and a constraint function formulated to maintain the SII at the target value. In various embodiments, gain computer 112 as discussed in this document is configured to compute the gains based on a solution to a constrained optimization problem as discussed below by way of example, but not by way of restriction.

Method of calculating SII is defined in ANSI S3.5-1997. An example of calculating the SII useable for solving the constrained optimization problem is discussed in C. Taal et al., "On optimal linear filtering of speech for near-end listening enhancement," *IEEE Signal Processing Letters,* 20(3): 225-228 (2013). In this example, the speech and noise are assumed to be above the threshold in quiet at a comfortable level. Effects of masking are excluded from the standard SII procedure (similar to an example discussed in B. Sauert et al., "Near end listening enhancement optimized with respect to speech intelligibility index and audio power limitations," in *Proc. Eur. Signal Processing Conf (EUSIPCO),* (2010). The SII is then determined by estimating the long-term average spectra of the speech and noise within critical bands, calculating the within-band SNR, clipped between −15 and 15 dB followed by normalization to the range of 0 and 1, and calculating a weighted average of the normalized within-band SNRs.

In this example (Taal et al.), more specifically, the time-domain signals of the clean speech and noise are x and ϵ, respectively, and $x_m$ is a windowed version of x, wherein m is the window frame-index. A Hann-window is used with an overlap of 50% and a length of 32 milliseconds. The impulse response of the $i^{th}$ auditory filter (i.e., the filter in the filter bank for the $i^{th}$ subband) is $h_i$, where $i \in \{1, \ldots, n\}$ and n is the total number of auditory filters (i.e., total number of subbands in the filter bank). The energy of the clean speech (without the noise) within one time-frequency (TF) unit is calculated by:

$$X_{m,i}^2 = \Sigma_k |X_m(k)|^2 |H_i(k)|^2, \quad (1)$$

where $X_m(k)$ is the DFT of $x_m$, and $H_i(k)$ is the DFT of $h_i$, with frequency-bin index k. Before performing the DFT, signals are sampled at 20 kHz where short-time frames are zero-padded to 64 milliseconds. A total of 64 auditory filters are used, with the center frequencies linearly spaced on an equivalent rectangular bandwidth (ERB) scale between 150 and 8500 Hz, and the squared magnitude responses $|H_i(k)|^2$ are chosen, as discussed in S. van de Par et al., "A perceptual model for sinusoidal audio coding based on spectral integration," *EURASIP J. Appl. Signal Process.*, vol. 2005, no. 9, pp. 1292-1304 (2005). The average speech energy within one critical band is:

$$\sigma_{x_i}^2 = \frac{1}{M} \sum_m X_{m,i}^2, \quad (2)$$

where M is the total number of short-time frames (e.g., several seconds) over which the energy in averaged. Similarly, the average noise energy $\sigma_{\epsilon_i}^2$ is:

$$\sigma_{\epsilon_i}^2 = \frac{1}{M} \sum_m \epsilon_{m,i}^2. \quad (3)$$

The SNR within one critical band is:

$$\xi_i = \frac{\sigma_{x_i}^2}{\sigma_{\epsilon_i}^2}, \quad (4)$$

which is used to calculate an intermediate measure of speech intelligibility within the one critical band. The SII as a weighted average is calculated as:

$$\text{SII} = \Sigma_i \gamma_i d(\xi_i), \quad (5)$$

where $\gamma$ is the band-importance function as given in the critical-band SII procedure (ANSI S3.5-1997, Table 1), and $d(\xi_i)$ is approximated by:

$$d(\xi_i) \approx \frac{\xi_i}{\xi_i + 1}. \quad (6)$$

The range of $d(\xi_i)$ is between 0 and 1. The SII as defined by (5) reduces the importance of bands with center frequency below 450 Hz and above 4000 Hz, and is expected to be a monotonic increasing function of the intelligibility of speech in the presence of noise. See ANSI S3.5-1997.

Gain computer 112 is configured to compute the gains to maintain the SII at a target value while minimizing an overall level of the speech. Thus, using the example (Taal et al.) of the SII calculation as discussed above, the constrained optimization problem according to the present subject matter is formulated as:

$$\min_{\alpha_i^2} \sum \alpha_i^2 \sigma_{x_i}^2, \quad (7a)$$

$$\text{such that } \sum_i \gamma_i^2 \frac{\alpha_i^2 \xi_i}{\alpha_i^2 \xi_i + 1} = \text{SII}_T, \text{ and} \quad (7b)$$

$$\alpha_i^2 \geq 0, \forall i, \quad (7c)$$

where (7a) is the objective function, (7b) and (7c) are the constraint functions, $\alpha_i$ are the gains, and $\text{SII}_T$ is the target value at which the SII is to be maintained. In various embodiments, the target value can be set by the user such as the listener.

Solving this as a Lagrange problem yields the following equations:

$$\alpha_i^2 = \max\left(0, \frac{1}{\xi_i}\left(\sqrt{\frac{\lambda \gamma_i}{\sigma_{\epsilon_i}^2}}\right) - 1\right), \forall i, \text{ and} \quad (8a)$$

$$f(\lambda) = \text{SII}_T - \sum_i \gamma_i \left(1 - \sqrt{\frac{\sigma_{\epsilon_i}^2}{\lambda \gamma_i}}\right), \lambda > 0. \quad (8b)$$

These equations can be solved iteratively using a zero-finding algorithm for the function (8b).

The constrained optimization problem is discussed to illustrate the present subject matter by way of example, but not by way of limitation. Other embodiments may use a different constraint expression, replace the objective function with a loudness function, use a different step-wise technique to find the gains, modify the target SII as a function of noise level, or includes level-dependent effects in the SII constraint calculation.

At 556, the speech signal is filtered into the frequency subbands by using the plurality of filters with the computed gains. Each filter of the plurality of filters has an adjustable gain.

At 558, an output sound is produced using the filtered speech signal and the environmental sound signal. In one embodiment, the environmental sound signal is filtered, for example using a band-pass filter. In various embodiments, the output signal is produced by mixing the filtered speech signal with the environmental sound signal, and further conditioned to include desirable characteristics and contents. In one embodiment, the output signal is produced by mixing the filtered speech signal with the filtered environmental sound signal.

At 560, the output sound is transmitted to the listener. In a further embodiment, the listener is able to listen to the speech while hearing sounds from his/her environment, thereby being made aware of the surroundings.

In one embodiment, method 550 is performed by a hearing aid, such as hearing aid 434, for delivering the speech to the hearing aid user. Step 552 is performed by a communication circuit of the hearing aid, such as communication circuit 440. Steps 554, 556, and 558 are performed by a processing circuit of the hearing aid, such as processing circuit 404. Step 560 is performed by a receiver (speaker) of the hearing aid, such as receiver 406. In a further embodiment, the environmental sound signal is received by a microphone of the hearing aid, such as microphone 442, and the processing circuit of the hearing aid produces the output signal using the speech signal and the microphone signal. In various embodiments, the speech signal is transmitted to the hearing aid from an audio device such as a telephone or an audio streaming device.

It is understood that the hearing aids referenced in this patent application include a processor (such as processing circuit 104, 204, or 404). The processor may be a digital signal processor (DSP), microprocessor, microcontroller, or other digital logic. The processing of signals referenced in this application can be performed using the processor. Processing may be done in the digital domain, the analog domain, or combinations thereof. Processing may be done using subband processing techniques. Processing may be done with frequency domain or time domain approaches. For simplicity, in some examples blocks used to perform frequency synthesis, frequency analysis, analog-to-digital conversion, amplification, and certain types of filtering and processing may be omitted for brevity. In various embodiments the processor is adapted to perform instructions stored in memory which may or may not be explicitly shown. In various embodiments, instructions are performed by the processor to perform a number of signal processing tasks. In such embodiments, analog components are in communication with the processor to perform signal tasks, such as microphone reception, or receiver sound embodiments (i.e., in applications where such transducers are used). In various embodiments, realizations of the block diagrams, circuits, and processes set forth herein may occur without departing from the scope of the present subject matter.

In various embodiments, the present subject matter provides for enhanced speech perception in audio devices including, but not limited to, hearing assistance devices such as hearing aids. One example of application is to maintain speech intelligibility while listening to a phone call via hearing aids in the presence of time-varying noise.

The present subject matter is demonstrated for hearing assistance devices, including hearing aids, including but not limited to, behind-the-ear (BTE), in-the-ear (ITE), in-the-canal (ITC), receiver-in-canal (RIC), or completely-in-the-canal (CIC) type hearing aids. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the user, including but not limited to receiver-in-canal (RIC) or receiver-in-the-ear (RITE) designs. The present subject matter can also be used in hearing assistance devices generally, such as cochlear implant type hearing devices. It is understood that other hearing assistance devices not expressly stated herein may be used in conjunction with the present subject matter.

This application is intended to cover adaptations or variations of the present subject matter. It is to be understood that the above description is intended to be illustrative, and not restrictive. The scope of the present subject matter should be determined with reference to the appended claims, along with the full scope of legal equivalents to which such claims are entitled.

What is claimed is:

1. An audio system, comprising:
   a speech input configured to receive a speech signal including speech;
   an environmental sound input configured to receive an environmental sound signal representing sounds in a listening environment;
   a processing circuit configured to produce an output signalspeci by processing the speech signal and the environmental sound signal, the processing circuit including:
   a speech filter configured to filter the speech signal by applying gains as a function of frequency to the speech signal; and
   a gain computer configured to compute the gains using the received speech signal and the received environmental sound signal to maintain a speech intelligibility index (SII) at a target value while minimizing a total energy of the speech at all frequencies, the target value set to a constant value; and
   a speaker configured to produce an output sound using the output signal.

2. The audio system of claim 1, wherein the speech filter comprises a plurality of filters for a plurality of frequency subbands, each filter of the plurality of filters having a gain of the computed gains that is applied to the subband of the each filter, and the gain computer is configured to determine a signal-to-noise ratio of the speech signal for each subband of the plurality of frequency subbands, maintain the SU at the target value as a function of the signal-to-noise ratios of the speech signal for the plurality of frequency subbands, and minimize the total energy of the speech over the plurality of frequency subbands.

3. The audio system of claim 2, wherein the processing circuit comprises:
   a mixing circuit configured to produce a combined signal by mixing the filtered speech signal with the environmental sound signal; and
   an output circuit configured to produce the output signal using the combined signal.

4. The audio system of claim 2, wherein the gain computer is configured to compute the gains using a solution to a mathematically formulated constrained optimization problem with an objective function formulated to minimize the total energy and a constraint function formulated to maintain the SII at the target value.

5. The audio system wherein the processing circuit is configured to produce the output signal by mixing the filtered speech signal with the environmental sound signal.

6. A hearing assistance system for delivering sound to a listener having an ear canal, comprising:
   a communication circuit configured to receive a speech signal including speech;
   a microphone configured to receive an environmental sound and produce a microphone signal representing the environmental sound; and
   a processing circuit configured to process the speech signal and the microphone signal and produce an output signal based on the speech signal and the microphone signal, the processing circuit including:
   a speech filter configured to filter the speech signal by applying gains as a function of frequency to the speech signal;
   a gain computer configured to compute the gains using the received speech signal and the microphone signal to maintain a speech intelligibility index (SII) at a target value while minimizing a total energy of the speech at all frequencies, the target value set to a constant value;
   an output circuit configured to produce an output signal using the filtered speech signal and the microphone signal; and
   a receiver configured to produce an output sound using the output signal and transmit the output sound to the ear canal of the listener.

7. The hearing assistance system of claim 6, wherein the processing circuit further comprises a band-pass microphone filter configured to filter the microphone signal, and the output circuit is configured to produce the output signal using the filtered speech signal and the filtered microphone signal.

8. The hearing assistance system of claim 7, wherein the processing circuit comprises a mixing circuit configured to produce a combined signal by mixing the filtered speech signal with filtered microphone signal, and the output circuit is configured to produce the output signal using the combined signal.

9. The hearing assistance system of claim 6, wherein the speech filter comprises a plurality of filters for a plurality of frequency subbands, each filter of the plurality of filters having a gain of the computed gains that is applied to the subband of the each filter, and the gain computer is configured to determine a signal-to-noise ratio of the speech signal for each subband of the plurality of frequency subbands, maintain the SII at the target value as a function of the signal-to-noise ratios of the speech signal for the plurality of frequency subbands, and minimize the total energy of the speech over the plurality of frequency subbands.

10. The audio system of claim 9, wherein the gain computer is configured to compute the gains using a solution to a mathematically formulated constrained optimization problem with an objective function formulated to minimize the total energy and a constraint function formulated to maintain the Sit at the target value.

11. The hearing assistance system of claim 6, comprising a hearing aid including the communication circuit, the microphone, the processing circuit, and the receiver.

12. The hearing assistance system of claim 11, further comprising an audio device configured to transmit the speech signal to the hearing aid, and the communication circuit is configured to wirelessly receive the speech signal from the audio device.

13. The hearing assistance system of claim 12, wherein the audio device comprises a telephone.

14. The hearing assistance system of claim 13, wherein the audio device comprises an audio streaming device.

15. A method for delivering sound to a listener, comprising:
receiving a speech signal including speech;
receiving an environmental sound signal representing sounds in the listener's environment;
filtering the speech signal by a plurality of filters for a plurality of frequency subbands, each filter of the plurality of filters having an adjustable gain;
computing the gains for the plurality of filters using the received speech signal and the received environmental sound signal to maintain a speech intelligibility index (SII) at a target value while minimizing the total energy of the speech over the plurality of frequency subbands, the gains each computed as a function of the frequency subband of the plurality of frequency subbands, the target value set to a constant value by the listener;
producing an output sound using the filtered speech signal and the environmental sound signal; and
transmitting the output sound to listener.

16. The method of claim 15, further comprising filtering the environmental sound signal using a band-pass filter, and wherein producing the output signal comprises mixing the filtered speech signal with the environmental sound signal.

17. The method of claim 15, wherein computing the gains comprises computing the gains using a solution to a mathematically formulated constrained optimization problem with an objective function formulated to minimize the total energy and a constraint function formulated to maintain the SII at the target value.

18. The method of claim 17, wherein computing the gains comprises:
determining a signal-to-noise ratio of the speech signal for each subband of the plurality of frequency subbands; and
calculating a weighted average of the signal-to-noise ratios for the plurality of frequency subbands.

19. The method of claim 15, wherein:
receiving the speech signal comprises receiving the speech signal using a communication circuit of a hearing aid;
filtering the speech signal, computing the gains, and producing the output sound comprise filtering the speech signal, computing the gains, and producing the output sound using a processing circuit of the hearing aid; and
transmitting the output sound to the listener comprises transmitting the output sound to the listener using a receiver of the hearing aid.

20. The method of claim 19, further comprising receiving an environmental sound and producing a microphone signal representing the environmental sound using a microphone of the hearing aid, and wherein producing the output signal comprises producing the output signal using the filtered speech signal and the microphone signal.

21. The method of claim 20, wherein receiving the speech signal comprises wirelessly receiving the speech signal from an audio device.

22. The method of claim 21, wherein receiving the speech signal from the audio device comprises receiving the speech signal from a telephone.

23. The method of claim 21, wherein receiving the speech signal from the audio device comprises receiving the speech signal from an audio streaming device.

* * * * *